United States Patent
Handy et al.

(10) Patent No.: US 11,101,643 B2
(45) Date of Patent: Aug. 24, 2021

(54) MULTI-SEMICONDUCTOR SOLID STATE POWER CONTROLLERS AND METHOD FOR MANAGING INDUCTIVE SWITCHING TRANSIENTS THEREOF

(71) Applicant: GE AVIATION SYSTEMS LIMITED, Cheltenham (GB)

(72) Inventors: Peter James Handy, Cheltenham (GB); Peter Michael Tyler, Cheltenham (GB); Julian Peter Mayes, Cheltenham (GB)

(73) Assignee: GE AVIATION SYSTEMS LIMITED, Gloucestershire (GB)

( * ) Notice: Subject to any disclaimer, the term of this patent is extended or adjusted under 35 U.S.C. 154(b) by 253 days.

(21) Appl. No.: 16/328,843

(22) PCT Filed: Sep. 12, 2017

(86) PCT No.: PCT/EP2017/072892
§ 371 (c)(1),
(2) Date: Feb. 27, 2019

(87) PCT Pub. No.: WO2018/050638
PCT Pub. Date: Mar. 22, 2018

(65) Prior Publication Data
US 2019/0199091 A1    Jun. 27, 2019

(30) Foreign Application Priority Data

Sep. 13, 2016 (GB) .................................... 1615536

(51) Int. Cl.
*H02H 9/00* (2006.01)
*H02H 7/22* (2006.01)
(Continued)

(52) U.S. Cl.
CPC ............ *H02H 9/005* (2013.01); *H02H 7/222* (2013.01); *H03K 17/08122* (2013.01);
(Continued)

(58) Field of Classification Search
None
See application file for complete search history.

(56) References Cited

U.S. PATENT DOCUMENTS 6,903,537 B2 * 6/2005 Tzeng .................. H02M 3/156
323/268
8,847,656 B1   9/2014 A et al.
(Continued)

FOREIGN PATENT DOCUMENTS

EP      2978005 A1    1/2016
WO   2015124884 A1    8/2015

OTHER PUBLICATIONS

Office Action for Canadian Patent Appl. No. 3,036,113, dated Mar. 31, 2020, 6 pages.
(Continued)

*Primary Examiner* — Stephen W Jackson
(74) *Attorney, Agent, or Firm* — Wood IP LLC

(57) ABSTRACT

Provided is a method and system that includes a direct current solid state power controller that includes a plurality of switching devices connected in parallel for performing switching, one or more main transient voltage suppressors (TVSs) to perform voltage clamping, a plurality of parasitic inductances each connected in series with a switching device of the plurality of switching devices, and a plurality of local TVSs each connected in parallel with a series connection of a switching device and at least one parasitic inductor of the plurality of parasitic inductances, to dissipate energy stored within the at least one parasitic inductor of the plurality of parasitic inductances.

13 Claims, 6 Drawing Sheets

(51) Int. Cl.
*H03K 17/0814* (2006.01)
*H03K 17/725* (2006.01)
*H03K 17/0812* (2006.01)
*H03K 17/16* (2006.01)

(52) U.S. Cl.
CPC ..... *H03K 17/08142* (2013.01); *H03K 17/162* (2013.01); *H03K 17/725* (2013.01); *H03K 2217/0063* (2013.01)

(56) References Cited

U.S. PATENT DOCUMENTS

| | | |
|---|---|---|
| 9,998,028 B2 * | 6/2018 | Eichler .................. H02M 7/003 |
| 10,569,301 B2 * | 2/2020 | Lei ............................ B06B 1/04 |
| 2013/0021700 A1 | 1/2013 | Greither |
| 2013/0208387 A1 | 8/2013 | Nguyen |
| 2015/0124884 A1 | 5/2015 | Yuzawa et al. |
| 2015/0222114 A1 | 8/2015 | Harper |

OTHER PUBLICATIONS

Great Britain Search Report and Written Opinion dated Feb. 21, 2017 which was issued in connection with GB1615536.8 which was filed on Sep. 13, 2016.

International Search Report and Written Opinion dated Dec. 12, 2017 which was issued in connection with PCT/EP2017/072892 which was filed on Sep. 12, 2017.

\* cited by examiner

MULTI-SEMICONDUCTOR SOLID STATE POWER CONTROLLERS AND METHOD FOR MANAGING INDUCTIVE SWITCHING TRANSIENTS THEREOF

TECHNICAL FIELD

The present invention relates generally to multi-semiconductor solid state power controllers (SSPCs). In particular, the present invention relates to managing inductive switching transients in SSPCs.

BACKGROUND

In electrical power distribution systems, electrical faults can occur in any of the devices included therein. To mitigate this problem, the electrical power distribution systems typically employ protection circuits to protect against these electrical faults.

There is an increasing demand for electrical power in systems (e.g., aircraft systems) which has driven the need for increasing line voltages. High power SSPCs are employed within the power distribution systems of the aircraft to allow for fast and controlled electrical fault protection. As current ratings are increased, there is a corresponding increase in the number of current carrying semiconductors. Accordingly, multiple semiconductor devices, such as metal oxide semiconductor field-effect transistors (MOSFETs), are typically used in the SSPCs.

FIG. 1 illustrates a typical MOSFET-based, Direct Current (DC) SSPC 10 of a power supply circuit. The SSPC 10 includes a voltage source (Vsrc) 12, a load (Zload) 14, an upstream wiring inductor (Lup) 16 connected to the voltage source 12, and a downstream load inductor (Ldn) 18. The SSPC 10 further includes switching devices (Q1, Q2, Qn) 20 connected in parallel to perform switching, gate resistors (Rg1, Rg2, Rgn) 22 and a gate voltage driver (Vgate) 24 to allow the switching devices 10 to turn on and off. During operation, opening of the SSPC, a flywheel diode (Dfwd) 26 recirculates the SSPC load current from the load inductor 18.

Two main transient voltage suppressors (TVSs) (Dtvsmain1 and Dtvsmain2) 30 are employed to perform voltage clamping to protect the switching devices 20. Switching currents in the order of hundreds of amperes cause high magnitude electrical voltage transients that must be clamped to prevent damage to the switching devices 20. The TVSs 30 are used to provide this clamping.

Due to the number of switching devices, the physical area occupied by these devices is large. As a result, distributed parasitic inductance is present between the main TVSs 30 and the switching device (Qn) 20, most distant from the main TVSs 30. The TVSs 30 have a parasitic inductance Ltvs 32 which can allow a voltage greater than the clamp voltage, across the terminals of the switching devices 20. This condition can cause avalanche breakdown in the switching devices 20 due to their parasitic inductances (Lpara1, Lpara2, Lpara3, Lpara4) 34.

BRIEF DESCRIPTION

Given the aforementioned deficiencies, a need exists to manage transients in multi-semiconductor SSPCs. Aspects of the present invention provide SSPC modules for power distribution systems and methods for managing transients in the SSPC modules.

Aspects of the present invention provide an approach for managing transients in multi-semiconductor SSPC modules. More particularly, the aspects provide approaches for protecting switching semiconductors from parasitic inductance. The additional use of smaller low-cost TVS devices, in addition to bulk TVS devices provides a low cost and scalable approach to managing electrical transients in multi-semiconductor SSPC modules.

In certain circumstances, aspects of the present invention provide a system including a DC solid state power controller. The DC solid state power controller includes a plurality of switching devices connected in parallel to perform switching. Also included is a pair of main TVSs to perform voltage clamping, a plurality of parasitic inductances each connected in series with a switching device of the plurality of switching devices, and a plurality of local TVSs. Each of the plurality of local TVSs is connected in parallel with the series combination of the switching device and at least one parasitic inductance of the plurality of parasitic inductances to dissipate energy stored within the at least one parasitic inductor of the plurality of parasitic inductances.

The foregoing has broadly outlined some of the aspects and features of various examples, which should be construed to be merely illustrative of various potential applications of the disclosure. Other beneficial results can be obtained by applying the disclosed information in a different manner or by combining various aspects of the disclosed examples. Accordingly, other aspects and a more comprehensive understanding may be obtained by referring to the detailed description of the exemplary examples taken in conjunction with the accompanying drawings, in addition to the scope defined by the claims.

Figure 1:
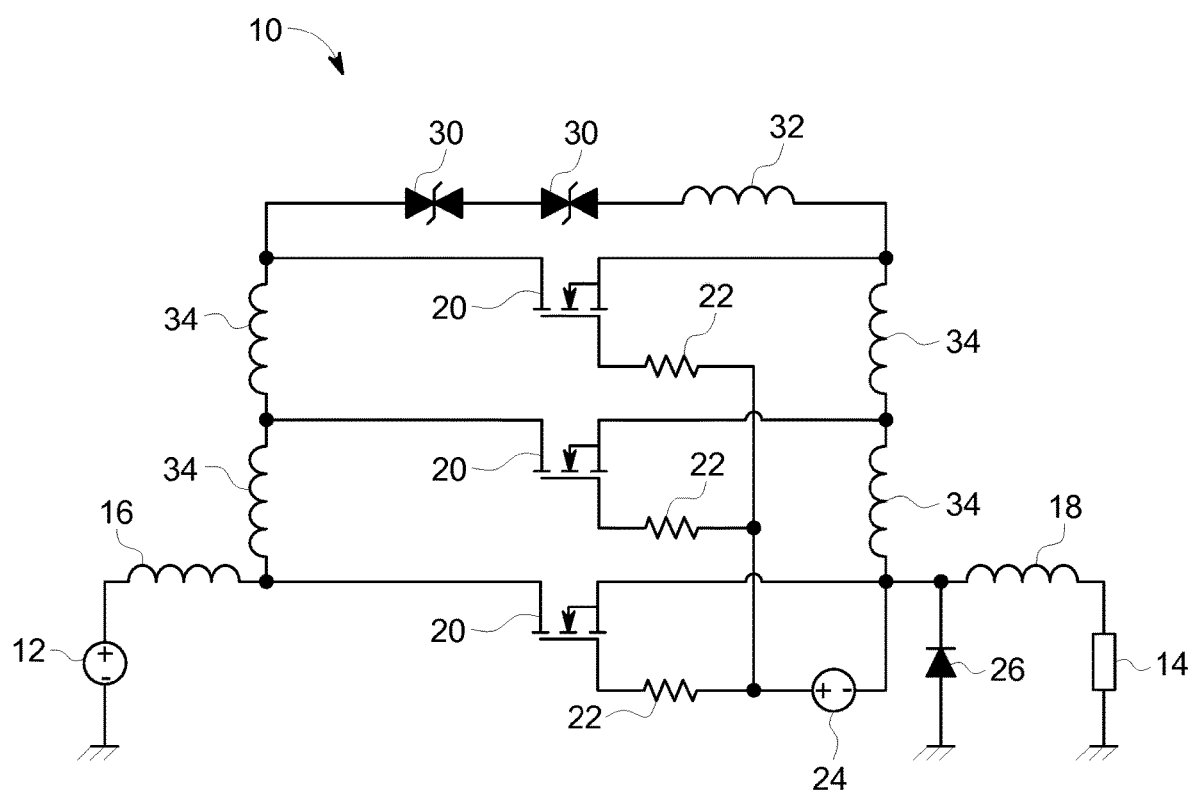
FIG. 1 is a circuit diagram illustrating an SSPC in a conventional power distribution system.

The drawings are only for purposes of illustrating embodiments and are not to be construed as limiting the disclosure. Given the following enabling description of the drawings, the novel aspects of the present disclosure should become evident to a person of ordinary skill in the art. This detailed description uses numerical and letter designations to refer to features in the drawings. Like or similar designations in the drawings and description have been used to refer to like or similar parts of embodiments of the invention.

DETAILED DESCRIPTION

As required, detailed embodiments are disclosed herein. It must be understood that the disclosed embodiments are merely exemplary of various and alternative forms. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

Figure 2:
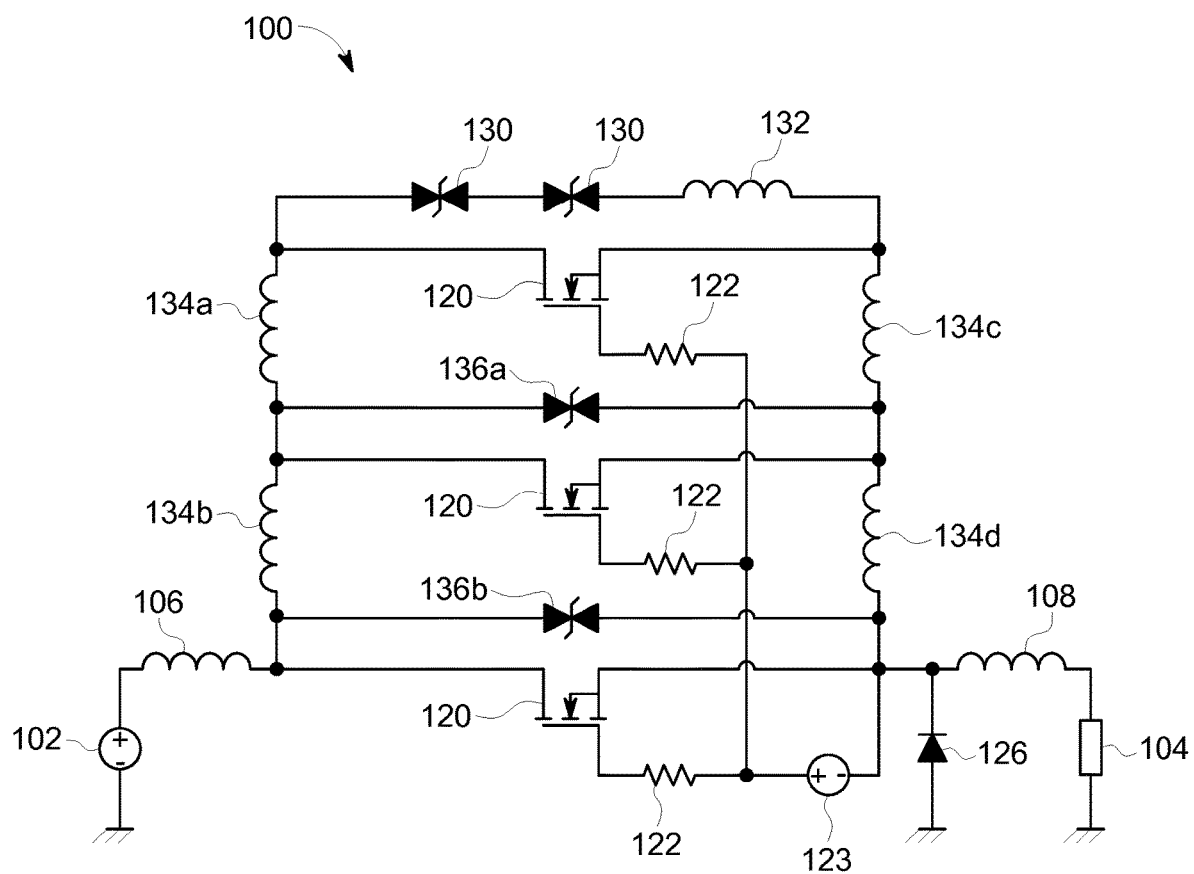
FIG. 2 is a circuit diagram illustrating an SSPC for DC applications in accordance with an embodiment of the present invention.

Embodiments of the present invention, for example, the embodiment illustrated in FIG. 2, use local TVS devices with lower power ratings to dissipate the energy stored in the parasitic circuit inductances. Depending on the SSPC layout, as demonstrated below, and magnitude of the resulting parasitic inductances, the number of TVSs can be as many as one TVS per switching semiconductor. Ultimately, fewer TVS devices can be used to optimize performance and reduce unit cost.

In particular, FIG. 2 is a circuit diagram illustrating an SSPC 100 for DC applications in accordance with the embodiments. By way of example, the SSPC 100 is suitable for use in aircraft systems. The present invention, however, is not limited to implementation within any particular type of system. The present invention can be implemented within any type of land, sea or air vehicle.

The SSPC 100 includes a voltage source (Vsrc) 102, a load (Zload) 104, an upstream wiring inductor (Lup) 106 connected to the voltage source 102, and a downstream load inductor (Ldn) 108 connected to the load 104. The SSPC 100 further includes a plurality of switching devices (Q1, Q2, Qn) 120 (e.g., MOSFETs) connected in parallel to perform switching. Also included is a plurality of gate resistors (Rg1, Rg2, Rgn) 122, each corresponding to a respective switching device 120 and connected to the gate of the respective switching device 120. Although the switching devices depicted in FIG. 2 are MOSFETs, the present invention is not limited hereto. Thus, any type of switching device suitable for the purposes set forth herein may be implemented.

A gate voltage driver (Vgate) 123 is also included to drive the switching devices 120 to turn on and off. The gate resistors 122 control input voltage from the gate voltage driver 123.

A flywheel diode (Dfwd) 126 is connected to the load inductor 108 to recirculate load current therefrom.

The SSPC 100 further includes a pair of main TVSs (Dtvsmain1 and Dtvsmain2) 130 for performing voltage clamping to protect the switching devices 120 to not exceed a predetermined gate threshold voltage. The TVSs 130 are connected in series with a parasitic TVS inductance Ltvs 132.

The switching devices 120 are connected in parallel with a plurality of parasitic inductances (Lpara1, Lpara2, Lpara3, Lpara4) 134a-134d. And the SSPC 100 further includes a plurality of local TVSs 136a, 136b corresponding to the plurality of switching devices 120.

Each switching device 120 is connected in parallel with a corresponding local TVS 136a, 136b. The number of local TVSs can be varied such that each switching device 120 has a corresponding local TVS 136. The local TVSs 136a, 136b have lower power ratings to dissipate energy stored in the inductances 134a-134d. As shown in FIG. 2, the TVS 136a dissipates energy stored in the inductances 134a and 134c and the TVS 136b dissipates energy stored in the parasitic inductances 134b and 134d.

In the embodiments, the combined maximum clamp voltages of the TVSs 130 are less than a minimum breakdown voltage of the switching devices 120. Further, the TVSs 136a and 136b have a minimum breakdown voltage greater than the maximum combined clamp voltages of the TVSs 130 and less than the minimum breakdown voltage of the switching devices 120. Therefore, the TVSs 136a and 136b only manage energy stored in the parasitic inductances 134a-134d. TVSs 136a and 136b do not manage the energy stored in the upstream and downstream inductors 106 and 108. The majority of the energy stored in the upstream and downstream inductors 106 and 108 is dissipated in the bulk TVS components 130. In large SSPCs containing many switching devices, it is impractical to achieve close proximity of the TVS devices 130 to all of the switching devices 120. By fitting the distributed TVS devices 136a 136b, any parasitic inductances are dissipated in the TVS devices 136a 136b rather than in the switching devices 120.

Figure 3:
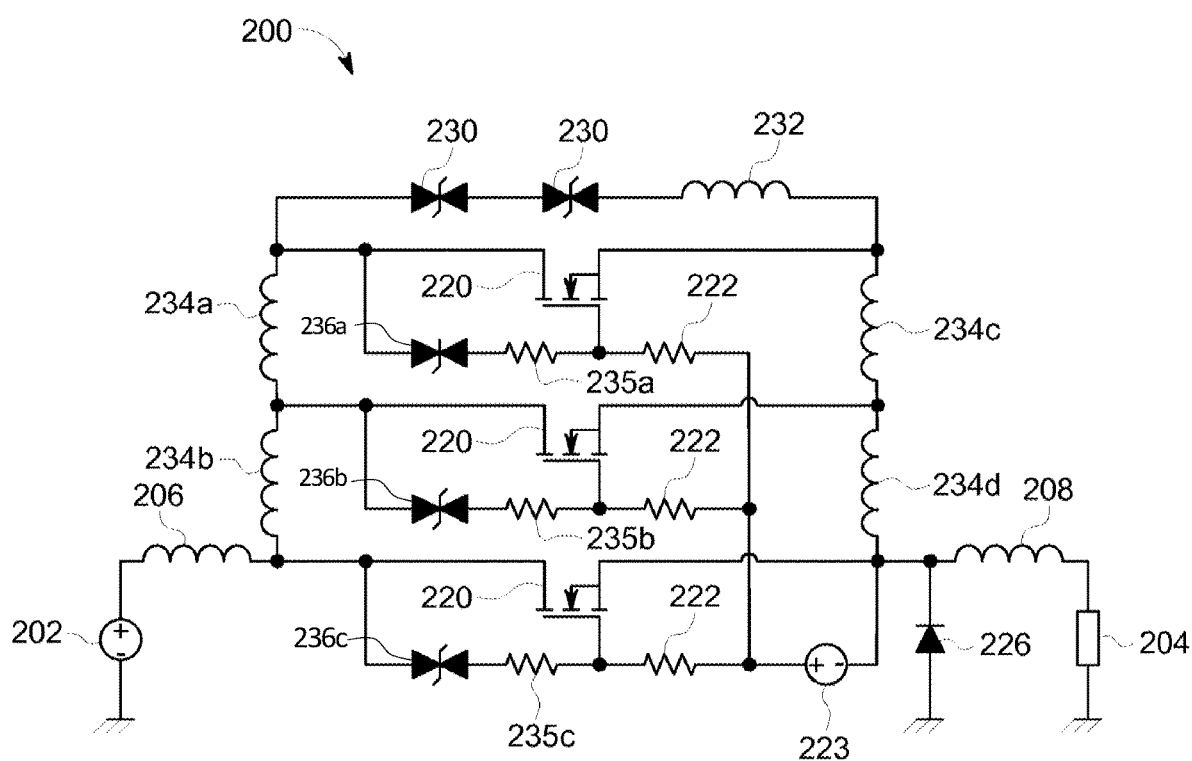
FIG. 3 is a circuit diagram illustrating an SSPC for DC applications in accordance with another embodiment of the present invention.

FIG. 3 illustrates an SSPC 200 according to another embodiment of the present invention. The SSPC 200 includes similar features as that of SSPC 100 shown in FIG. 2. The SSPC 200, however, also includes a local TVS 236a-236c connected in series with a bias resistor (Rb) 235a-235c corresponding to each switching device 220 to further dissipate energy stored in corresponding parasitic inductances 234a-234d.

As shown in FIG. 3, the SSPC 200 includes a voltage source 202, a load 204, an upstream inductor 206 and a downstream inductor 208 respectively connected to the voltage source 202 and the load 204. The SSPC 200 further includes a plurality of switching devices 220 for performing switching, and a plurality of gate resistors 222 whereby each gate resistor 222 is connected to the gate of each switching device 220. A gate voltage driver 223 is connected to the gate resistors 222 such that the gate resistors 222 control the input voltage from the gate voltage driver 223 to the switching devices 220, to thereby control the switching devices 220 to turn on and off.

A flywheel diode 226 is connected to the downstream inductor 208 to recirculate the load current from the load 204. The SSPC 200 further includes a pair of main TVSs 230 and corresponding parasitic TVS inductance 232.

Further, the plurality of parasitic inductances 234a-234d are connected to each switching device 220. The plurality of bias resistors (Rb1, Rb2, Rbn) 235a-235c are provided and correspond to each switching device 220. The plurality of local TVSs (D1, D2, Dn) 236a-236c are each connected in series with a corresponding one of the bias resistors 235a-235c to only dissipate the energy stored in the parasitic inductances 234a-234d. Alternatively, the TVSs 236a-236c can be replaced by two small signal series connected back-to-back Zener diodes.

According to embodiments of the present invention, the combined maximum clamp voltages of the main TVSs 230 are less than the minimum breakdown voltage of the switching devices 220. Further, the threshold voltage of the switching devices 220 can sum up with the clamp voltage of each local TVS 236a-236c. This summing results in a clamp voltage higher than the breakdown voltage of the local TVSs 236a-236c. This summing also results in a minimum clamp voltage which is greater than the maximum clamp voltage of the main TVS devices 230.

Figure 4:
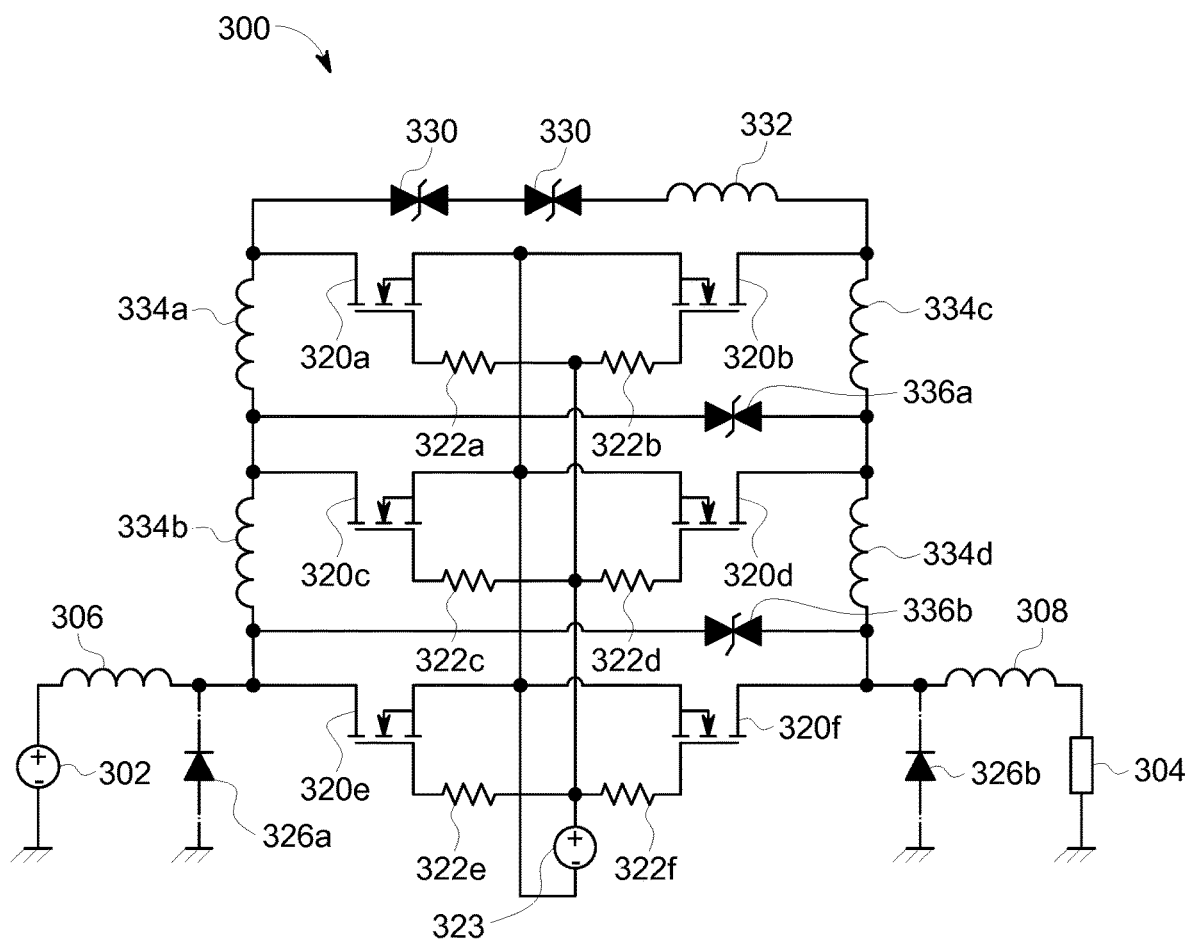
FIG. 4 is a circuit diagram illustrating an SSPC for an Alternating Current (AC) application in accordance with an embodiment of the present invention.
Figure 5:
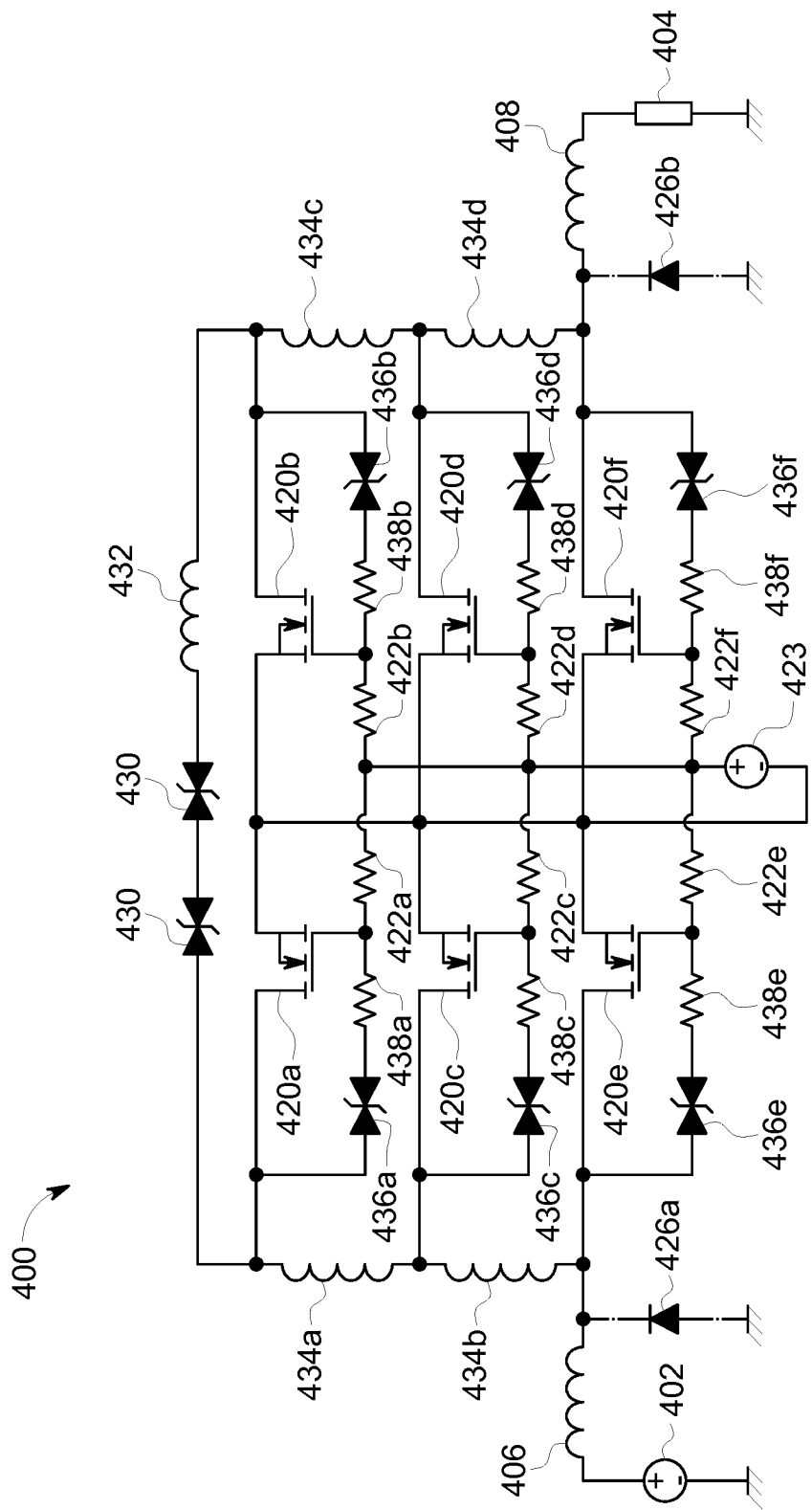
FIG. 5 is a circuit diagram illustrating an SSPC for AC applications in accordance with another embodiment of the present invention.

The present invention is not limited to DC applications and can be applied to AC applications as depicted in FIGS. 4 and 5. More specifically, the SSPCs 300 and 400 in FIGS. 4 and 5 are bi-directional AC equivalents to the DC SSPCs 100 and 200 in FIGS. 2 and 3.

As shown in FIG. 4, the SSPC 300 includes a voltage source 302, a load 304, an upstream inductor 306 and a downstream inductor 308. A plurality of switching devices (Q1a, Q1b, Q2a, Q2b, Qna, Qnb) 320a-320f are also provided for performing switching. A plurality of gate resistors (Rg1a, Rg2b, Rg2a, Rg2b, Rgna, Rgnb) 322a-322f are also provided corresponding to each switching device 320a-320f respectively and connected to a gate thereof.

The gate resistors 322a-322f are connected between each gate and a gate voltage driver 323 for driving voltage input to the switching devices 320. A pair of flywheel diodes (Dfwda and Dfwdb) 326a and 326b are provided and respectively corresponding to the upstream inductor 306 and the downstream inductor 308 to perform recirculation of DC load currents during opening of the SSPC 300.

A pair of main TVSs 330 are provided to perform voltage clamping at the switching devices 320a-320f. The TVSs 330 include a parasitic inductor (Ltvs) 332.

Further, a plurality of parasitic inductances 334a-334d are connected in series with, and corresponding to, the switching devices 320a-320d. For example, the parasitic inductances 334a and 334c respectively correspond to the switching devices 320a and 320b.

The SSPC 300 also includes a plurality of local TVSs 336a and 336b provided in parallel with the switching devices 320a-320f, and in series with the parasitic inductances 334a-334d. The local TVSs 336a and 336b dissipate the energy from the parasitic inductances 334a-334d such that the TVS 336a dissipates energy from the parasitic inductances 334b and 334d.

In FIG. 5, the SSPC 400 includes similar features as the SSPC 300 shown in FIG. 4. Additionally, the SSPC 400 includes a voltage source 402, a load 404, an upstream inductor 406 and a downstream inductor 408, and a plurality of switching devices 420a-420f connected with a plurality of gate resistors 422a-422f at gates thereof. The plurality of gate resistors 423a-423f are connected between the gates of the switching devices 420a-420f and a voltage gate driver 423, to control the input voltage at the gates.

A pair of flywheel diodes 426a and 426b are also provided to recirculate load current at the load 404. The SSPC 400 further includes a plurality of local TVSs 436a-436f each connected in series with one of a plurality of bias resistors (Rb1a, Rb1b, Rb2a, Rb2b, Rbna, Rbnb) 438a-438f and connected to the parasitic inductances 434a-434d to dissipate the energy stored therein. Alternatively, the TVSs 436a-436f can be replaced by two small signal series connected back-to-back Zener diodes in accordance with other embodiments.

Figure 6:
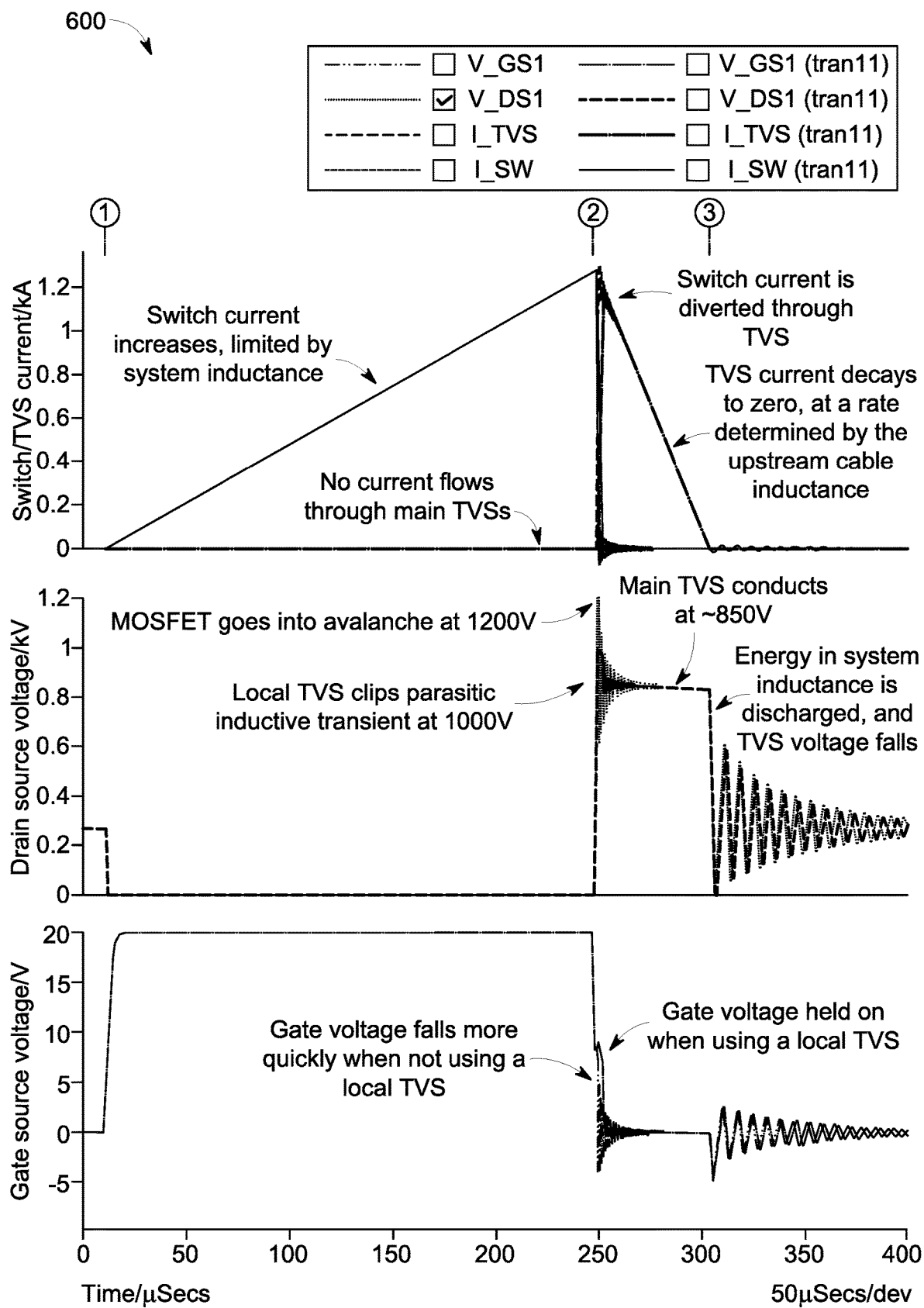
FIG. 6 is a graph illustrating an example operation of the SSPC shown in FIG. 3, in accordance with the embodiments.

FIG. 6 is a graph illustrating exemplary operation of the SSPC 200 shown in FIG. 2. The details of the graph 600 will be discussed with reference to FIG. 2. As shown in the graph 600, and by way of example only and not limitation, prior to point (1) a voltage across the SSPC 100 is 270 VDC, indicating that the SSPC 100 is open. At point (1) the SSPC 100 is closed and current rises up to 1250 A.

At point (2) on the graph 600, the SSPC current passes 1250A and the SSPC is tripped to open. In the case where only the main TVSs 130 are fitted, at point (2), the drain-source voltage across the switching devices 120 reaches the avalanche breakdown voltage at 1200V thus causing damage. When local TVSs 136a and 136b are employed, at point (2), the drain-source voltage across the MOSFET devices reaches a secondary clamp voltage of approximately 1000V.

Shortly after point (2), the parasitic inductances 134a-134d and main TVS inductances 132 are dissipated, and the main TVS 130 takes over clamping at 850V. Therefore, the local TVSs 136a and 136b only manage a small amount of the energy stored in the parasitic inductances 234a-234d. At point (3) the main TVS current falls to zero and all of the inductive energy is dissipated.

This written description uses examples to disclose the invention including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What we claim is:

1. A direct current solid state power controller system comprising:
   a plurality of switching devices connected in parallel for performing switching;
   one or more main transient voltage suppressors connected in parallel to the plurality of switching devices and configured to perform voltage clamping;
   a plurality of parasitic inductances, each connected in series with a switching device of the plurality of switching devices; and
   a plurality of local transient voltage suppressors, each connected in parallel with a switching device of the plurality of switching devices and configured to dissipate energy stored within at least one parasitic inductance of the plurality of parasitic inductances,
   wherein the plurality of local transient voltage suppressors have a minimum breakdown voltage greater than a maximum combined clamp voltage of the one or more main transient voltage suppressors.

2. The system of claim 1, further comprising:
   a voltage source for supplying power to the solid state power controller system;
   a load arranged to receive the power; and
   a flywheel diode arranged to recirculate load current to the load.

3. The system of claim 1, further comprising:
   a main transient voltage suppressor inductor connected in series with the one or more of main transient voltage suppressors wherein the one or more main transient voltage suppressors are configured to dissipate energy from the main transient voltage suppressor inductor.

4. The system of claim 3, wherein the plurality of local transient voltage suppressors have a minimum breakdown voltage less than a minimum breakdown voltage of the plurality of switching devices.

5. The system of claim 4, further comprising a plurality of bias resistors connected to each switching device, wherein each local transient voltage suppressors is connected in series with a bias resistor of the plurality of bias resistors, to dissipate energy of the at least one parasitic inductance.

6. The system of claim 5, wherein a plurality of switching devices comprising a plurality of metal-oxide semiconductor field effect transistors, wherein the bias resistors are each connected to a gate of a metal-oxide semiconductor field effect transistor of the plurality of metal-oxide semiconductor field effect transistor.

7. A bi-directional alternating current solid state power controller system, comprising:
   a plurality of pairs of switching devices, each pair is connected in parallel for performing switching;

one or more main transient voltage suppressors connected in parallel to the plurality of pairs of switching devices and configure to perform voltage clamping;

a plurality of parasitic inductances each connected in series with a switching device of the plurality of pairs of switching devices; and a plurality of local transient voltage suppressors, each connected in parallel a switching device of the plurality of switching devices, and configured to dissipate energy stored within at least one parasitic inductance of the plurality of parasitic inductances, wherein the plurality of local transient voltage suppressors have a minimum breakdown voltage greater than a maximum combined clamp voltage of the one or more main transient voltage suppressors.

8. The system of claim 7, further comprising:

a voltage source for supplying power to the solid state power controller system;

a load arranged to receive the power; and a pair of flywheel diodes each respectively connected to the voltage source and to the load, and arranged to recirculate load current to the load.

9. The system of claim 8, further comprising:

a main transient voltage suppressor inductor connected in series with one or more main transient voltage suppressors, wherein the one or more main transient voltage suppressors are configured to dissipate energy from the main transient voltage suppressor inductor.

10. The system of claim 9, wherein the combined clamp voltage of the one or more transient voltage suppressors is less than a minimum breakdown voltage of the plurality of switching devices.

11. The system of claim 9, further comprising a plurality of bias resistors connected to each switching device, wherein each local transient voltage suppressor is connected in series with a bias resistor of the plurality of bias resistors, to dissipate energy of the at least one parasitic inductance.

12. The system of claim 11, wherein plurality of switching devices comprising a plurality of metal-oxide semiconductor field effect transistors, wherein the bias resistors are each connected to a gate of a metal-oxide semiconductor field effect transistor of the plurality of metal-oxide semiconductor field effect transistors.

13. A method for managing transients in a direct current solid state power controller, the method comprising:

performing switching with a plurality of switching devices connected in parallel;

performing voltage clamping using one or more main transient voltage suppressors connected in parallel to the plurality of switching devices;

connecting at least one parasitic inductance of a plurality of parasitic inductances in series with a switching device of the plurality of switching devices; and connecting a local transient voltage suppressor in parallel with a switching device of the plurality of switching devices, and dissipating energy stored within the at least one parasitic inductance of the plurality of parasitic inductances, wherein the local transient voltage suppressor has a minimum breakdown voltage greater than a maximum combined clamp voltage of the one or more main transient voltage suppressors.

* * * * *